United States Patent
Wang et al.

(10) Patent No.: US 7,012,813 B2
(45) Date of Patent: Mar. 14, 2006

(54) RETAINING DEVICE FOR EXPANSION CARDS

(75) Inventors: Liang-Chin Wang, Tu-chen (TW); Jung-Chi Chen, Tu-chen (TW); Wei Xiang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 223 days.

(21) Appl. No.: 10/654,294

(22) Filed: Sep. 2, 2003

(65) Prior Publication Data

US 2004/0174687 A1 Sep. 9, 2004

(30) Foreign Application Priority Data

Mar. 5, 2003 (TW) .............................. 92203294 U

(51) Int. Cl.
*H05K 7/14* (2006.01)
*H05K 7/18* (2006.01)

(52) U.S. Cl. ...................... 361/801; 361/753; 361/754; 361/797

(58) Field of Classification Search ................ 361/801, 361/686, 752, 797, 753, 754, 725, 732, 759; 211/41.17
See application file for complete search history.

(56) References Cited

U.S. PATENT DOCUMENTS

| | | | |
|---|---|---|---|
| 5,317,483 A | | 5/1994 | Swindler |
| 6,138,839 A | * | 10/2000 | Cranston et al. .......... 211/41.17 |
| 6,487,070 B1 | * | 11/2002 | Gan ........................... 361/683 |
| 6,681,939 B1 | * | 1/2004 | Kuo et al. ................ 211/41.17 |
| 6,788,550 B1 | * | 9/2004 | Dean et al. ................. 361/801 |
| 6,816,367 B1 | * | 11/2004 | Liu et al. .................... 361/685 |

* cited by examiner

*Primary Examiner*—Kamand Cuneo
*Assistant Examiner*—Hung S. Bui
(74) *Attorney, Agent, or Firm*—Wei Te Chung

(57) ABSTRACT

A retaining device (1) for expansion cards (56) each having a slot cover (60) includes a plate (18) having an expansion card seat (24), a pair of locking members (76), a fastener (90) pivotably attached to the expansion card seat. Two locking members respectively are fixed on the expansion card seat. Each locking member includes a resilient arm (80) having a locking body (81). The fastener includes a pressing plate (104) for pressing the slot covers. Two locking arms (112) extend from the pressing plate engaging with corresponding locking bodies. The fastener further includes a handle (118) and two pushing arms (120). When the handle is pressed downwardly, the pushing arms push the resilient arms to cause the locking bodies to disengage from the locking arms, and the pressing plate can thereupon be released from the slot covers of the expansion cards by operation of the handle.

20 Claims, 6 Drawing Sheets

US 7,012,813 B2

RETAINING DEVICE FOR EXPANSION CARDS

BACKGROUND OF THE INVENTION

1. Field of the Invention

The present invention relates to retaining devices, and more particularly to a retaining device securely retaining expansion cards in a computer enclosure.

2. Description of the Related Art

Personal computer systems typically include a motherboard for mounting at least one microprocessor and other application specific integrated circuits (ASICS) such as memory controllers, input/output (I/O) controllers and the like. Most motherboards have slots for attachment of additional adapter cards to provide additional functions for the computer system. Typical adapter cards include memory cards, sound cards, graphics cards, and the like. If a personal computer is moved to another location or sustains external shock, the attached adapter cards are prone to be loosened or detached from the slots of the motherboard. Accordingly, the adapter cards must be securely retained in position.

A retaining device to that end is disclosed in U.S. Pat. No. 5,317,483. The retaining device comprises a pressing plate, an end of which is rotatably attached to the rear plate. In assembly, an opposite end of the pressing plate is attached to a rear plate with a screw. The pressing plate presses slot covers of expansion cards, thereby securing the expansion cards to the rear plate. However, the structure of the retaining device is unduly complex, and this reduces efficiency when assembling the expansion cards to the retaining device.

SUMMARY OF THE INVENTION

Accordingly, an object of the present invention is to provide a retaining device which can readily and securely attach expansion cards in a computer enclosure.

To achieve the above-mentioned object, a retaining device for expansion cards each having a slot cover comprises a plate having an expansion card seat for securing the slot covers thereon, a pair of locking members respectively fixed on the expansion card seat, a fastener pivotably attached to the expansion card seat. The expansion card seat comprises a top plate and two side plates. Each locking member comprises a resilient arm. A locking body is arranged at a distal end of each resilient arm. The fastener comprises a pressing plate for pressing the slot covers against the top plate. Two locking arms respectively extend from two ends of the pressing plate engaging with corresponding locking bodies. The fastener further comprises a handle. A pair of connecting beams interconnects the pressing plate and the handle. A pair of pushing arms extends from the connecting beams. When the handle is pressed downwardly, the pushing arms push the resilient arms to cause the locking bodies to disengage from the locking arms and the pressing plate is released from the slot covers of the expansion cards via operation of the handle.

Other objects, advantages and novel features of the present invention will become more apparent from the following detailed description when taken in conjunction with the accompanying drawings, in which:

DETAILED DESCRIPTION OF THE INVENTION

Figure 1:
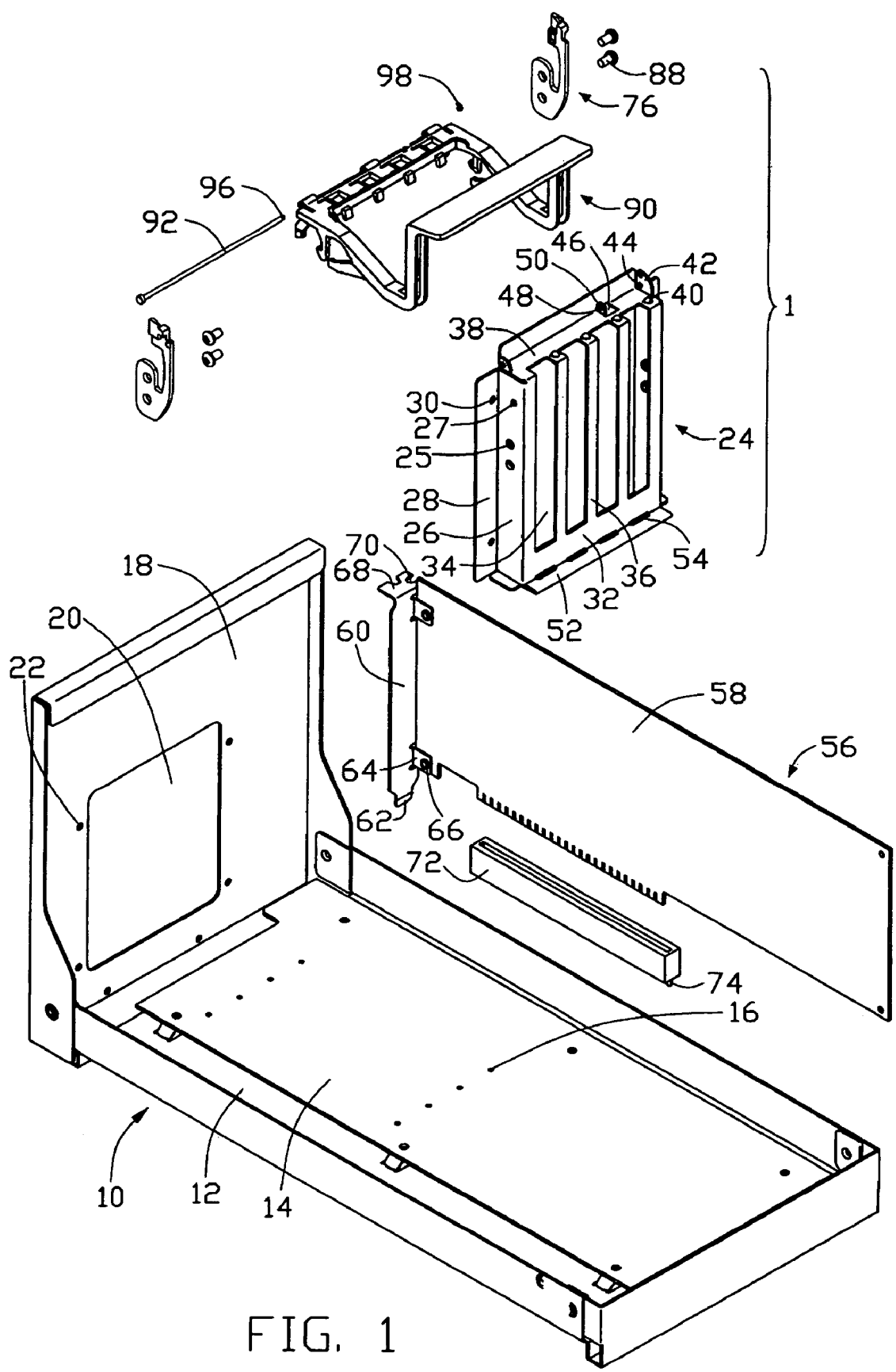
FIG. 1 is an exploded, isometric view of a retaining device in accordance with a preferred embodiment of the present invention, together with an expansion card and a computer enclosure having a circuit board with an expansion card socket.

Referring to FIG. 1, a retaining device 1 for expansion cards in accordance with the preferred embodiment of the present invention includes a rear plate 18, an expansion card seat 24, a pair of locking members 76 fixed on the expansion card seat 24, and a fastener 90 pivotably attached to the expansion card seat 24. The retaining device 1 secures respective ends of one or more expansion cards 56 (only one shown) that are connected onto a circuit board 14 attached on a bottom plate 12 of a computer chassis 10.

A plurality of bores 16 is defined in the circuit board 14, for fixing of expansion card sockets 72 (only one shown) onto the circuit board 14. The rear plate 18 is perpendicularly attached to an end of the bottom plate 12. A rectangular opening 20 is defined in the rear plate 18. A plurality of apertures 22 is defined in the rear plate 18, the apertures 22 surrounding the opening 20. The expansion card socket 72 has a plurality of pins 74 inserted into corresponding bores 16 of the circuit board 14.

The expansion card seat 24 includes a main plate 32, a top plate 38, a lower plate 52 and two side plates 26, all of which cooperatively define a chamber therebetween. Two flanges 28 extend perpendicularly outwardly from rearmost edges of the side plates 26 respectively. A plurality of apertures 30 is defined in the flanges 28, corresponding to the apertures 22 of the rear plate 18.

A plurality of parallel, vertical expansion card slots 34 is defined in the main plate 32. A column 36 is thereby defined between each two adjacent expansion card slots 34. A protrusion 40 is formed on the top plate 38 above each column 36. A pair of sector-shaped pivot tabs 42 extends perpendicularly upwardly from opposite sides of the top plate 38 respectively. A pivot hole 44 is defined in each pivot tab 42. A window 46 is defined in the top plate 38. A supporting tab 48 extends upwardly from the top plate 38 at an end of the window 46. A supporting hole 50 is defined in the supporting tab 48. A plurality of receiving slots 54 is defined in the lower plate 52 under the expansion card slots 34 respectively. A pair of screw holes 25 is defined in each side plate 26, for receiving a corresponding pair of screws 88. A locking protrusion 27 is outwardly formed on each side plate 26 above the screw holes 25.

The expansion card 56 comprises a main body 58, a bottom of the main body 58 being inserted into the expansion card socket 72. The expansion card 56 has a slot cover 60 perpendicularly attached to a rear edge thereof. The slot cover 60 comprises two spaced securing tabs 64, each securing tab 64 defining a through hole 66 therein. A pair of screws (not shown) is extended through the through holes 66 and engaged in the main body 58, thereby attaching the slot cover 60 to the main body 58. A bearing tab 68 extends perpendicularly rearwardly from a top of the slot cover 60. A cutout 70 is defined in the bearing tab 68, corresponding to any one of the protrusions 40 of the expansion card seat 24.

Figure 3:
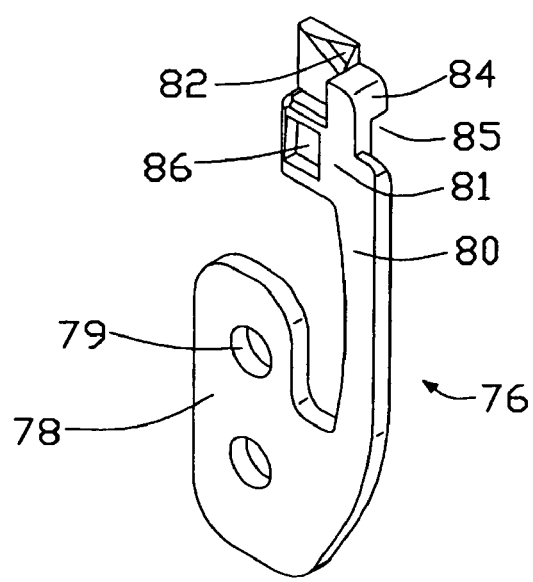
FIG. 3 is an enlarged view of one locking member of the retaining device of FIG. 1.
Figure 4:
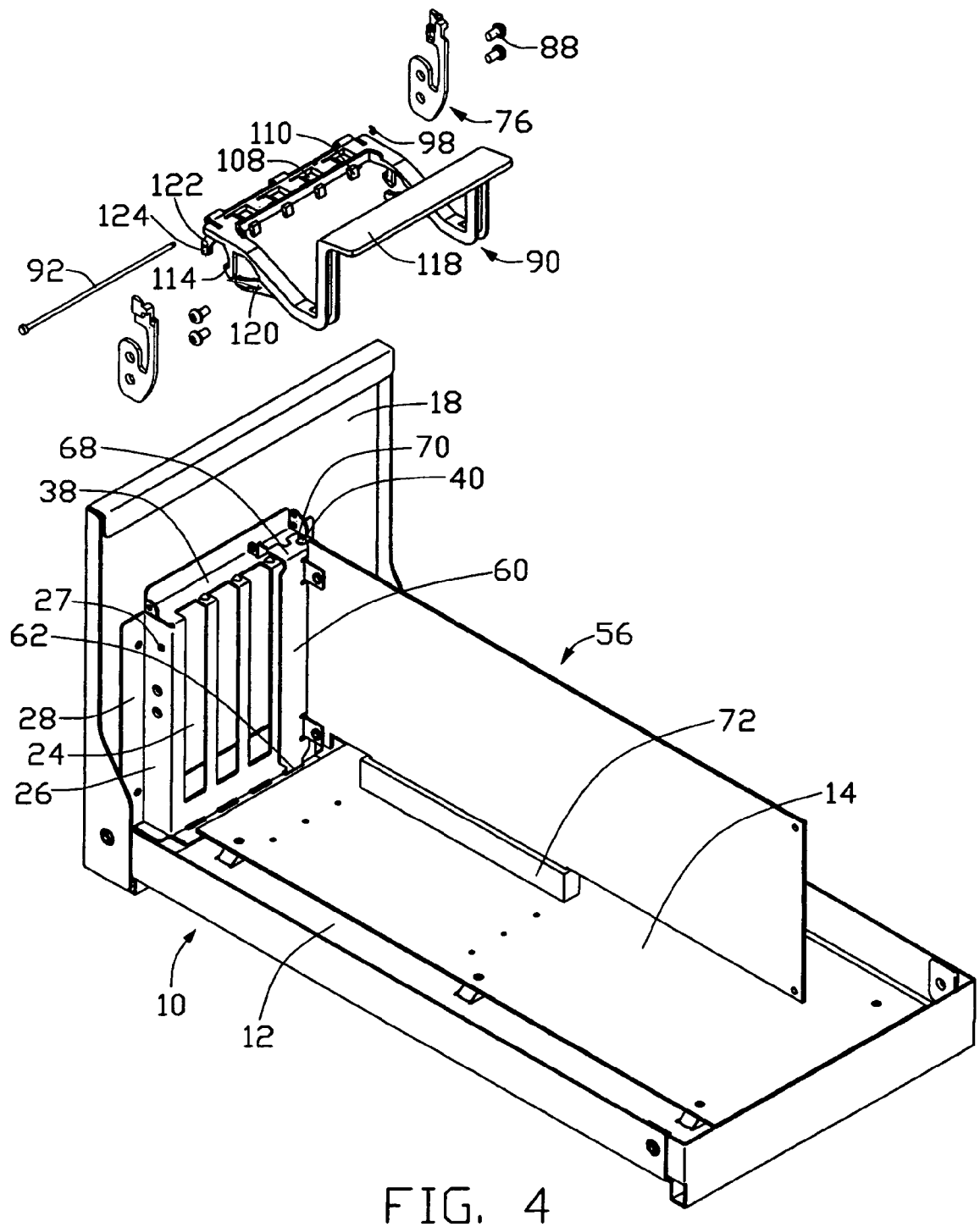
FIG. 4 is a partly assembled view of FIG. 1.
Figure 5:
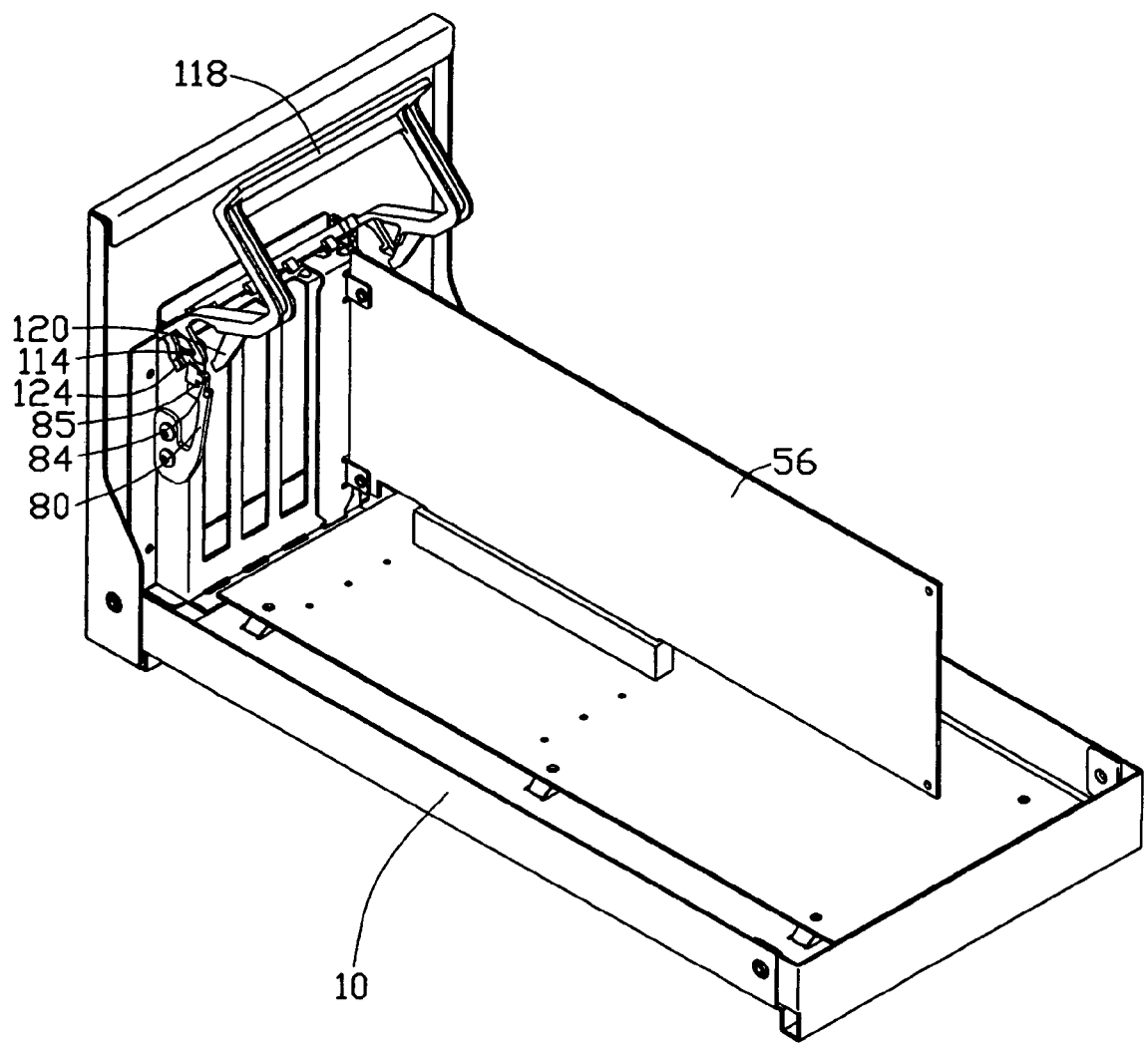
FIG. 5 is a fully assembled view of FIG. 1, showing the fastener in an unlocked position.
Figure 6:
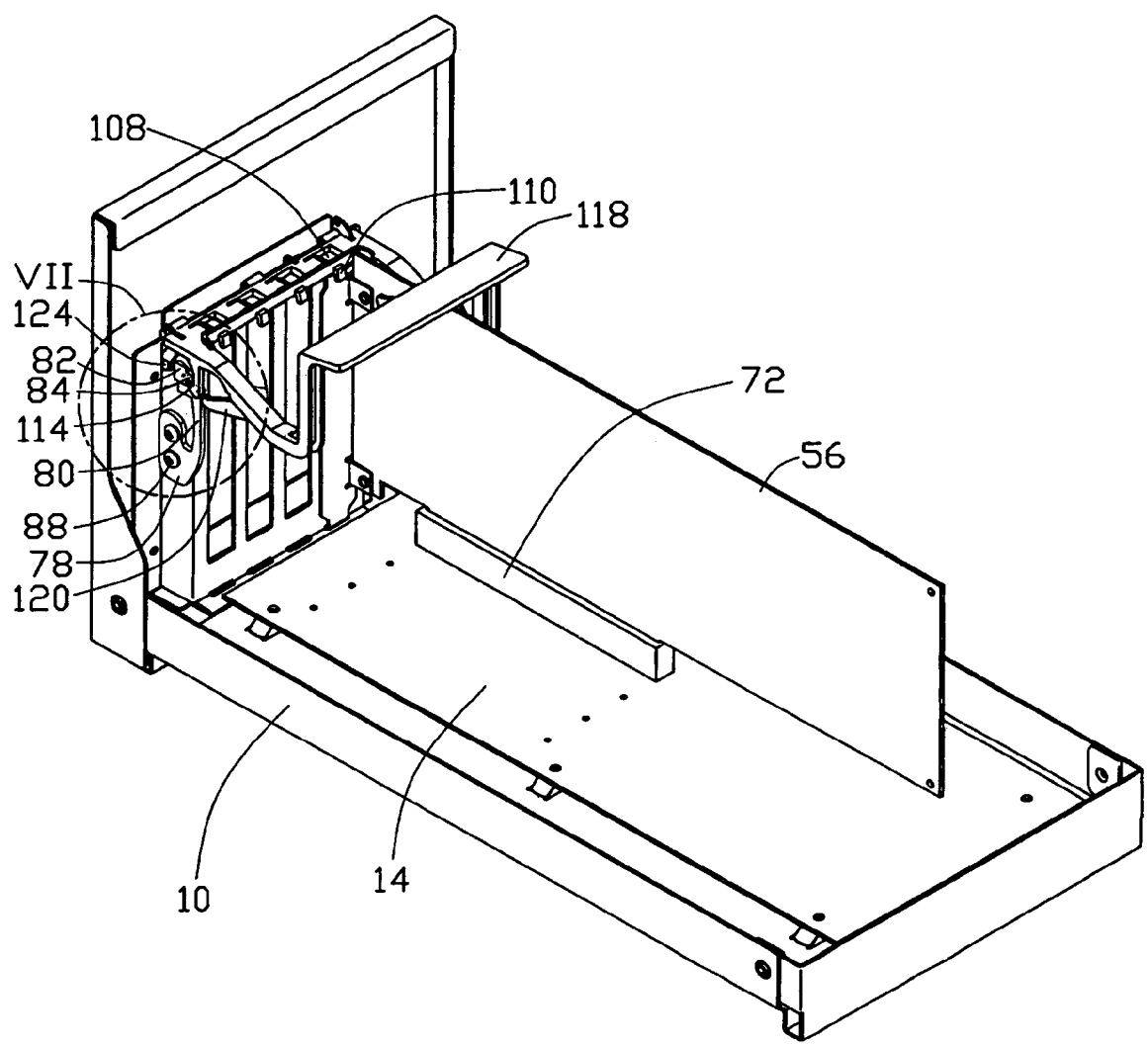
FIG. 6 is similar to FIG. 5, but showing the fastener in a locked position.
Figure 7:
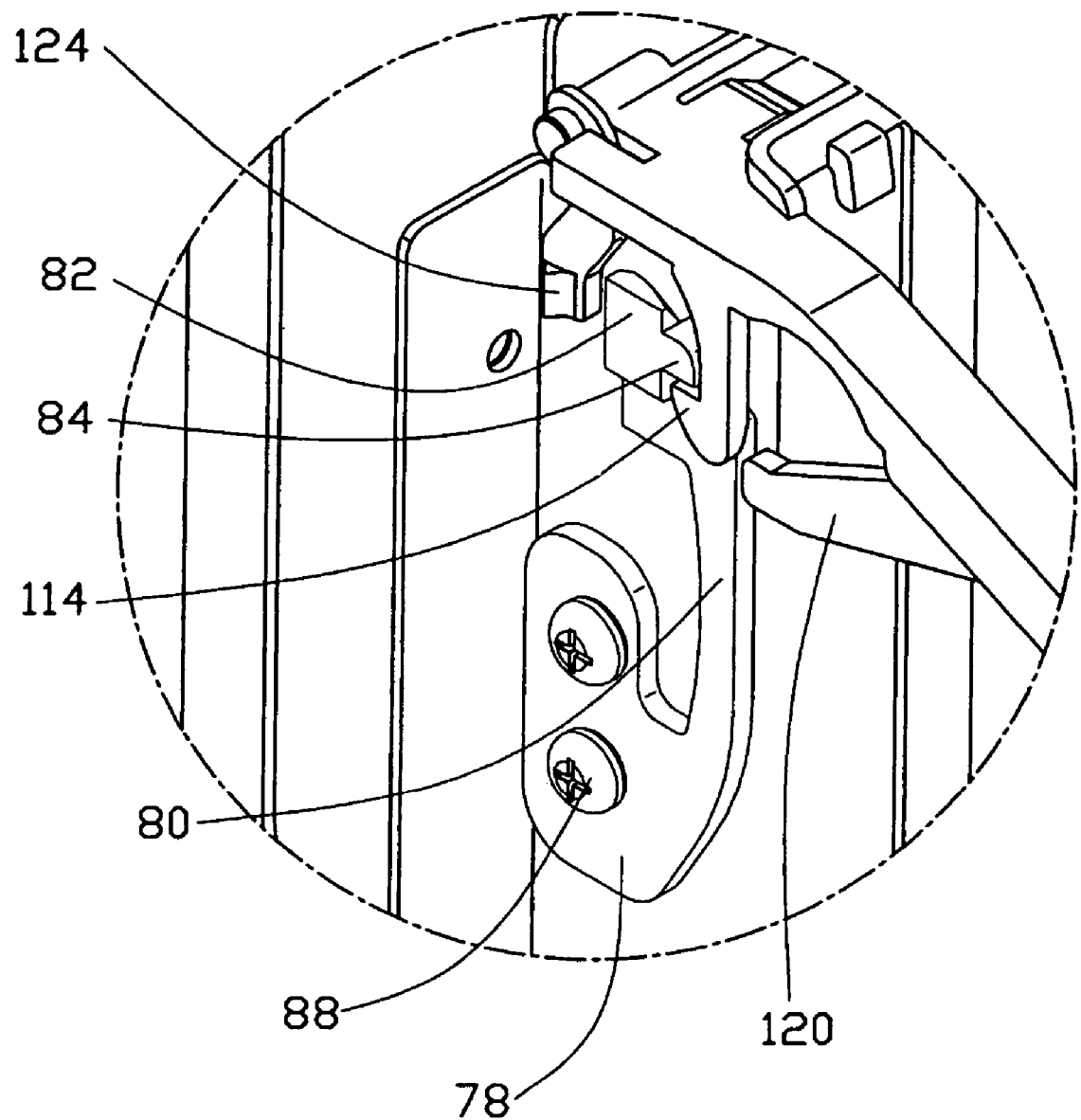
FIG. 7 is an enlarged view of a circled portion VII of FIG. 6.

Referring to FIG. 3, each locking member 76 comprises a fixing body 78 for being fixed to a respective side plate 26. A pair of fixing holes 79 is defined in the fixing body 78, corresponding to the screw holes 25 of the respective side plate 26. A resilient arm 80 extends upwardly from the fixing body 78. A locking body 81 extends upwardly from a top of the resilient arm 80. The locking body 81 comprises an upper retaining protrusion 84, thereby defining a cavity 85 under the retaining protrusion 84. A locking notch 86 is defined in an inside of the locking body 81 adjacent the retaining protrusion 84, corresponding to the locking protrusion 27 of the respective side plate 26. The locking body 81 further comprises a post 82 extending upwardly from above the locking notch 86.

Figure 2:
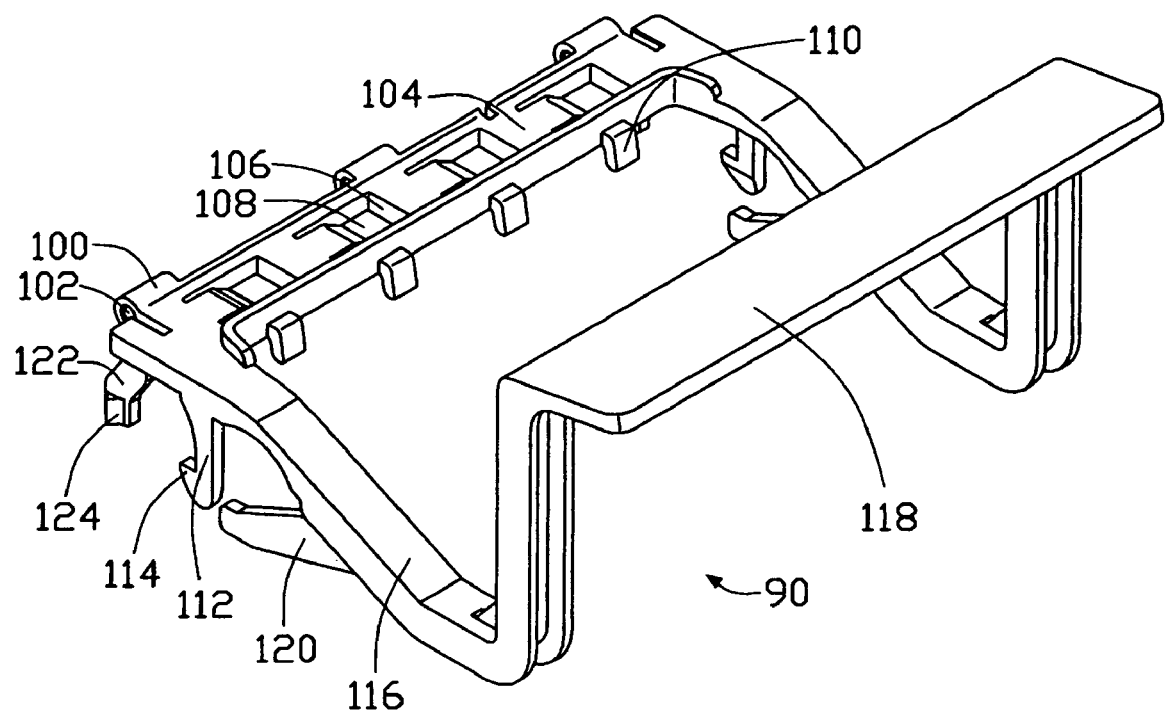
FIG. 2 is an enlarged view of a fastener of the retaining device of FIG. 1.

Referring to FIG. 2, the fastener 90 is for being pivotably attached to the pivot tabs 42 of the top plate 38 by a shaft 92. A narrowed neck portion 96 is defined at an end of the shaft 92. A spring clip 98 is for being engaged around the neck portion 96. The fastener 90 comprises an elongate pressing plate 104, a generally U-shaped handle 118, and a pair of connecting beams 116 interconnecting the pressing plate 104 and the handle 118. The pressing plate 104 forms a plurality of aligned sleeves 100 along a rear edge thereof. Each sleeve 100 defines a pivot hole 102 for receiving the shaft 92. A plurality of aligned breaches 106 is defined in the pressing plate 104, respectively corresponding to the expansion card slots 34. A spring tab 108 extends from an edge of the pressing plate 104 at each breach 106. A plurality of tabs 110 depends from a front edge of the pressing plate 104. Two locking arms 112 depend from respective opposite sides of the connecting beams 116 near the pressing plate 104. Each locking arm 112 comprises a hook 114 at a distal end thereof. A pair of pushing arms 120 extends slantwise downwardly from the respective connecting beams 116 toward the locking arms 112. A pair of fingers 122 depends from opposite sides of the pressing plate 104 respectively. Each finger 122 comprises a triangulated protrusion 124 at a distal end thereof.

Referring to FIGS. 3–7, in assembly, the expansion card seat 24 is attached to the rear plate 18 by means of a plurality of screws or rivets being extending through the apertures 30, 22. The expansion card socket 72 is attached to the circuit board 14, with the pins 74 of the expansion card socket 72 being inserted into the corresponding bores 16 of the circuit board 14. The locking members 76 are attached to the expansion card seat 24, with the screws 88 being extended through the fixing holes 79 of the locking members 76 to engage in the screw holes 25 of the side plates 26. The shaft 92 is inserted through the pivot holes 44, the pivot holes 102 and the supporting hole 50. The spring clip 98 is engaged around the neck portion 96 of the shaft 92. The fastener 90 is thus pivotably attached to the expansion card seat 24.

Then the fastener 90 is locked to the top plate 38 of the expansion card seat 24 as follows. The expansion card 56 is inserted into the expansion card socket 72. The inserting portion 62 of the slot cover 60 is inserted into a corresponding receiving slot 54. The cutout 70 engagingly receives a corresponding protrusion 40 of the top plate 38. The handle 118 is rotated downwardly. The locking arms 112 abut against the retaining protrusions 84, and ride over the retaining protrusions 84 until the hooks 114 are engagingly received in the cavities 85. In this position, the hooks 114 are engaged with undersides of the retaining protrusions 84, a corresponding spring tab 108 resiliently presses the bearing tab 68 of the expansion card 56, and a corresponding tab 110 presses the slot cover 60. Thus the expansion card 56 is securely held in the expansion card socket 72. The engagements of the hooks 114 in the cavities 85 prevent the fastener 90 from being rotated upwardly by accident.

In disassembly, the handle 118 is pushed downwardly. The resilient arms 80 of the locking members 76 are moved toward the rear plate 18 by the pushing arms 120. The locking protrusions 27 of the side plates 26 enter the locking notches 86, thereby attaching the locking bodies 81 to the side plates 26 while simultaneously displacing the locking bodies 81 outwardly. The hooks 114 are thus freed from the retaining protrusions 84 of the locking bodies 81. The handle 118 is rotated upwardly, and the triangulated protrusions 124 of the fingers 122 enter respective gaps between the posts 82 of the locking bodies 80 and the side plates 26. The triangulated protrusions 124 push the posts 82 away from the side plates 26 so that the locking bodies 81 at the locking notches 86 disengage from the locking protrusions 27, whereupon the resilient arms 80 rebound back to their original positions. The spring tab 108 disengages from the bearing tab 68, and the tab 110 disengages from the slot cover 60. The expansion card 56 is then easily removed from the rear plate 18 and the expansion card socket 72.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retaining device for expansion cards, each of the expansion cards having a slot cover, the retaining device comprising:
    a main plate having an expansion card seat for securing the slot covers thereon;
    a pair of locking members respectively fixed on opposite sides of the expansion card seat, each of the locking members comprising a resilient arm, and a locking body at an end of the resilient arm; and
    a fastener pivotably attached to the expansion card seat, the fastener comprising a pressing plate for pressing the slot covers against the expansion card seat, two locking arms depending from the pressing plate and engaging with corresponding locking bodies, a handle, a pair of connecting beams interconnecting the pressing plate and the handle, and a pair of pushing arms extending from the connecting beams;
    wherein when the handle is pressed downwardly, the pushing arms push the resilient arms to cause the locking bodies to disengage from the locking arms, and the pressing plate can thereupon be released from the slot covers of the expansion cards by operation of the handle.

2. The retaining device as claimed in claim 1, wherein each of the locking bodies comprises a retaining protrusion, and the locking arms respectively engage with the retaining protrusions.

3. The retaining device as claimed in claim 1, wherein the expansion card seat comprises a top portion and a pair of side plates, and wherein the fastener is pivotably attached to the top portion and the locking members are fixed on the side plates.

4. The retaining device as claimed in claim 3, wherein a locking protrusion is formed on each of the side plates of the expansion card seat, and each of the locking bodies defines a locking notch, the locking notches engagingly receiving the locking protrusions when the pushing arms push the resilient arms.

5. The retaining device as claimed in claim 4, wherein each of the locking bodies comprises a post extending upwardly from above the locking notch, and two fingers respectively extend from two sides of the pressing plate, wherein the fingers push the posts away from the side plates to cause the locking bodies at the locking notches to disengage from the protrusions.

6. The retaining device as claimed in claim 5, wherein each of the fingers comprises a protrusion at a distal end thereof, the protrusions entering respective gaps between the posts and the side plates of the expansion card seat.

7. The retaining device as claimed in claim 3, wherein the main plate defines a plurality of apertures, two flanges respectively extend from rear portions of the side plates, and the flanges define a plurality of apertures corresponding to the apertures of the main plate.

8. The retaining device as claimed in claim 3, wherein the side plates of the expansion card seat define a plurality of screw holes, and the locking members define a plurality of fixing holes for extension of screws therethrough to engage in the screw holes.

9. The retaining device as claimed in claim 3, wherein a plurality of spring tabs extends from the pressing plate, for pressing the slot covers of the expansion cards on the top portion of the expansion card seat.

10. The retaining device as claimed in claim 3, wherein a plurality of tabs depends from an edge portion of the pressing plate, for pressing the slot covers of the expansion cards.

11. A computer enclosure comprising:
a plurality of expansion card sockets for receiving a plurality of expansion cards, each of the expansion cards having a slot cover;
a main plate having an expansion card seat for securing the slot covers thereon, the expansion card seat comprising a pair of locking means; and
a retaining device comprising:
a pair of locking members respectively fixed on the expansion card seat, each of the locking members comprising a resilient arm and a locking body at an end of the resilient arm; and
a fastener pivotably attached to the expansion card seat; the fastener comprising a pressing plate for pressing the slot covers against the expansion card seat, a pair of locking arms engaging with the locking bodies, and a pair of pushing arms for pushing the resilient arms;
wherein the pushing arms are capable of pushing the resilient arms to cause the locking bodies to engage with the locking means of the expansion card seat, thereby allowing the locking arms to disengage from the locking bodies and the pressing plate to be released from the slot covers of the expansion cards.

12. The computer enclosure as claimed in claim 11, wherein each of the locking bodies comprises a retaining protrusion, and the locking arms respectively engage with the retaining protrusions.

13. The computer enclosure as claimed in claim 11, wherein the expansion card seat comprises a top portion and a pair of side plates, the fastener is attached to the top portion, and the locking members are fixed on the side plates.

14. The computer enclosure as claimed in claim 13, wherein the pair of locking means is a pair of locking protrusions formed on the side plate of the expansion card seat, and each of the locking bodies defines a locking notch, the locking notches engagingly receiving the locking protrusions when the pushing arms push the resilient arms.

15. The computer enclosure as claimed in claim 14, wherein each of the locking bodies comprises a post extending upwardly from the locking notch, and two fingers respectively extend from opposite ends of the pressing plate, the fingers pushing the posts away from the side plates to cause the locking bodies at the locking notches to disengage from the locking protrusions.

16. The computer enclosure as claimed in claim 15, wherein each of the fingers comprises a protrusion at a distal end thereof, the protrusions entering respective gaps between the posts and the side plates of the expansion card seat.

17. The computer enclosure as claimed in claim 13, wherein a plurality of spring tabs extends from the pressing plate for pressing the slot covers of the expansion cards on the top portion of the expansion card seat.

18. The computer enclosure as claimed in claim 13, wherein a plurality of tabs depends from an edge portion of the pressing plate, for pressing the slot covers of the expansion cards.

19. The computer enclosure as claimed in claim 11, wherein the fastener further comprises a handle and a pair of connecting beams interconnecting the pressing plate and the handle, the pushing arms extending from the connecting beams.

20. A computer enclosure assembly comprising:
an expansion card seat structure defining a plurality of expansion card slots extending therethrough in a front-to-back direction, and a top support plate extending along a lengthwise direction perpendicular to said front-to-back direction above said expansion card slots;
at least one locking member moveably mounted to the expansion card seat structure;
a fastener mounted to the expansion card seat structure and pivotal relative to said expansion card seat structure about an axis extending along said lengthwise direction; and
at least one expansion card with a slot cover being mounted to the expansion card seat structure; wherein when said fastener is located in a horizontal position and locked with the locking member which is in a first position, the fastener cooperates with the top support plate to retainably sandwich the slot cover therebetween;
when a portion of said fastener is downwardly deflected, the locking member is forced to move from the first position to a second position and temporarily held by the expansion card seat structure at said second position so as to allow the fastener to be disengaged from the locking member and successively further upwardly rotated to an upper position above said horizontal position, where the fastener no longer cooperates with the top support plate to retainably sandwich the slot cover therebetween, under a condition that the locking member is automatically transformed from the second position back to the first position during upward rotation of the fastener for next time locking usage.

* * * * *